United States Patent [19]

Scholz et al.

[11] Patent Number: 4,809,337

[45] Date of Patent: Feb. 28, 1989

[54] AUDIO NOISE GATE

[75] Inventors: Donald T. Scholz, Wayland; William F. Clack, Waltham, both of Mass.

[73] Assignee: Scholz Research & Development, Inc., Waltham, Mass.

[21] Appl. No.: 877,225

[22] Filed: Jun. 20, 1986

[51] Int. Cl.[4] .......................................... H04B 15/00
[52] U.S. Cl. ........................................ 381/94; 381/98; 333/28 T
[58] Field of Search .................... 381/94, 63, 106, 98; 455/222, 224, 225; 333/287

[56] References Cited

U.S. PATENT DOCUMENTS

| | | | |
|---|---|---|---|
| 3,753,159 | 8/1973 | Burwen | 381/94 |
| 3,989,897 | 11/1976 | Carver | 381/94 |
| 4,589,136 | 5/1986 | Poldy et al. | 381/94 |
| 4,622,692 | 11/1986 | Cole | 381/94 |
| 4,633,501 | 12/1986 | Werrbach | 333/28 T |
| 4,649,564 | 3/1987 | Barnett | 381/63 |
| 4,703,507 | 10/1987 | Holden | 381/94 |
| 4,739,514 | 4/1988 | Short et al. | 381/106 |

Primary Examiner—Forester W. Isen
Attorney, Agent, or Firm—Wolf, Greenfield & Sacks

[57] ABSTRACT

An audio noise gate having a main audio circuit having a filter with a control terminal for determining frequency response and having at least two different roll-off frequencies including one that rolls-off high end content audio signals and one that passes high end content audio signals. The main circuit is controlled from two secondary circuits one including a high pass filter for determining high frequency content of the audio signal and the other comprising a signal detection circuit including a peak detector for determining absence or presence of a note. The signal detection circuit operates in combination with the high pass filter circuit to provide for automatic adjustment of the noise gate to control the release time, quickly for short notes and slowly for held notes. The output of the high pass filter circuit also includes a peak detector and a gain stage for controlling the frequency response of the main circuit.

13 Claims, 2 Drawing Sheets

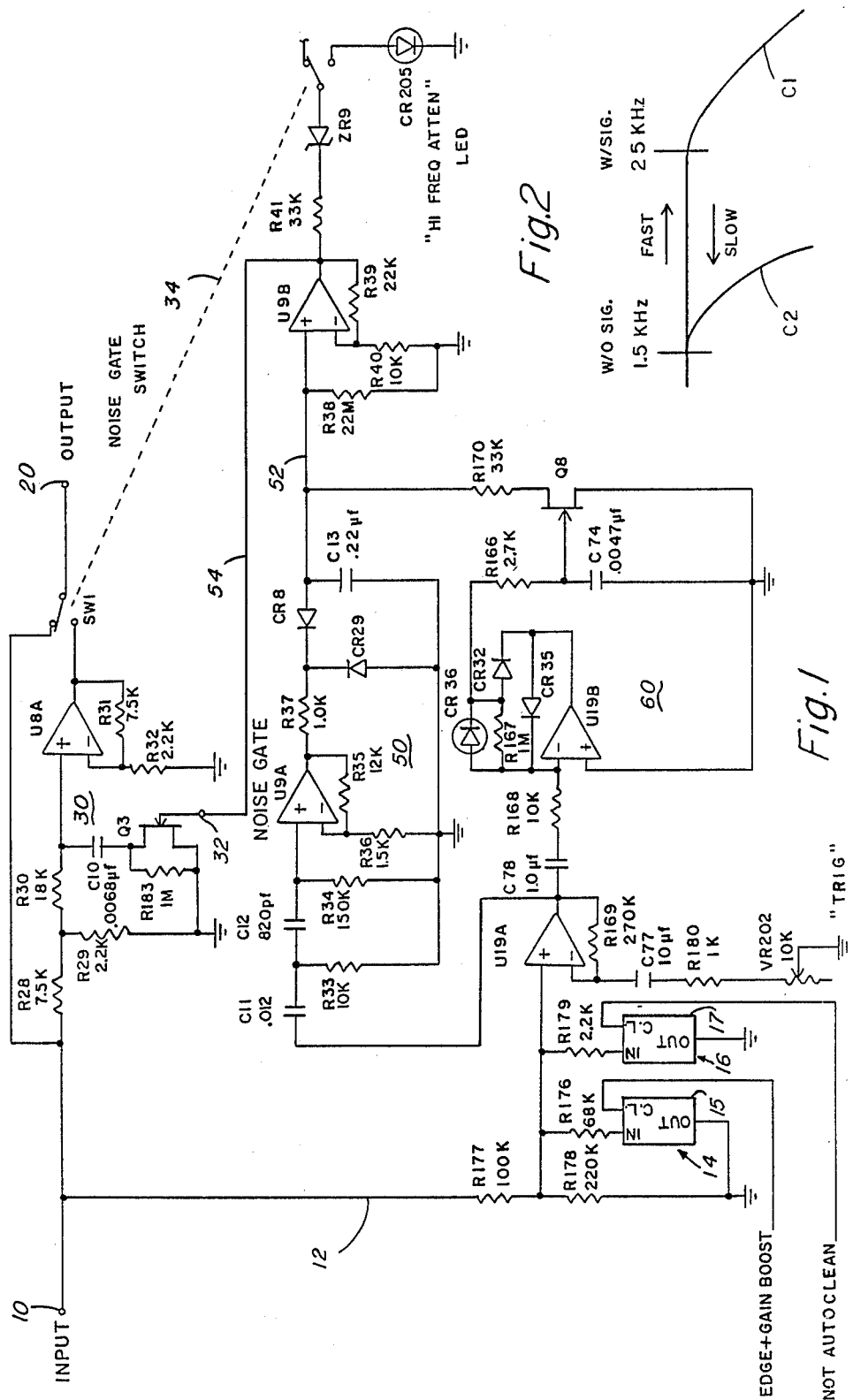

AUDIO NOISE GATE

BACKGROUND OF THE INVENTION

The present invention relates in general to an audio noise gate and pertains, more particularly, to a noise gate that automatically removes high frequency noise.

It is an object of the present invention to provide an improved audio noise gate and one which in particular is adapted to automatically remove high frequency noise.

Another object of the present invention is to provide an improved high frequency noise gate that is adapted to roll-off the upper portion of the audio spectrum, say above 1.5 KHz when no high frequencies are present in the audio signal.

A further object of the present invention is to provide an improved high frequency noise gate the will not only minimize compressor hiss pumping at high sustain settings, but will also assist in removing hiss and buzz from single coil pick-ups or any other special effects devices.

Still another object of the present invention is to provide a high frequency noise gate that is adapted to automatically turn off hiss at a relatively slow rate (slow release time) when notes are held and that furthermore turns off the hiss quickly when notes are stopped short. The noise gate of this invention adjusts its own release time; quickly for staccato notes and slowly for notes held for infinite sustain.

SUMMARY OF THE INVENTION

To accomplish the foregoing and other objects, features and advantages of the invention, there is provided an audio noise gate that is adapted to remove high frequency noise (hiss or buzz). In accordance with the apparatus of the invention the upper portion of the audio spectrum is rolled off preferably at 6 dB per octave about a frequency on the order of 1.5 KHz when no high frequencies are present in the signal. When high frequencies are present in the signal when the upper portion of the audio spectrum is not rolled off. When the roll off occurs this leaves the fundamental and low harmonics unaltered for their full sustain. The noise gate of the present invention minimizes compressor hiss pumping at high sustain settings and also removes hiss and buzz from single coil pick-ups. In accordance with the invention the gate operates to automatically turn off hiss slowly when notes are held and quickly when notes are stopped short. The circuit operates so that it will not cut off the end of a note or be fooled into letting noise through if the operator bumps the guitar strings inadvertently. The attack time of the gate is extremely fast and does not degrade transients. There is provided in association with the gate a trigger setting for setting the sensitivity of the threshold of the gate.

More particularly, in accordance with the invention there is provided an audio noise gate that comprises an input terminal for receiving an input audio signal that may have high end audio signal content, and an output terminal. Circuit means are provided coupled between the input and output terminals and including a high audio frequency filter having a control terminal for determining frequency response and hving at least two different roll-off frequencies including one that rolls off high end audio signal content and one that passes high end audio signal content. A high pass filter circuit is coupled from the input terminal for sensing high end audio signal content. Means are provided coupling the high pass filter circuit to the control terminal of the high pass audio filter to roll-off high end content audio signals through the circuit means in the absence of sensing high end audio signals by the high pass filter circuit, and to alternatively pass high end content audio signals through the circuit means in the presence of sensing high end audio signals by the high pass filter circuit. The combination also includes a signal detection means for detecting whether a note has been played or sustained. This is coupled from the input terminal for determining the presence or absence of the audio signal. The means for coupling the high pass filter circuit to the control terminal of the circuit means includes a high frequency detector circuit having a predetermined attack and release time. This high frequency detector circuit may comprise an amplifier coupled from the high pass filter circuit and a peak detector followed by another amplifier for providing additional gain. The output of this second amplifier then in turn couples to the control terminal of the circuit means. The output of the signal detection means couples to the high frequency detector circuit to control the release time thereof. The signal detection means may comprise an amplifier and peak detector for determining when an audio signal is present. When the signal is present then the release time of the gate is unaltered so as to maintain a relatively slow release time. However, when the signal detection means detects an interruption of the audio signal the circuit then provides for a substantial reduction in release time. This thus provides the automatic operation that turns off hiss slowly when notes are held and quickly when notes are stopped short or should one inadvertently touch a string without actually intending to play it.

BRIEF DESCRIPTION OF THE DRAWINGS

Numerous other objects features and advantages of the invention should now become apparent upon a reading of the following detailed description taken in conjunction with the accompanying drawings, in which:

FIG. 1 is a circuit diagram of the preferred embodiment of the audio noise gate of the present invention;

FIG. 2 is a fragmentary response diagram associated with the noise gate of FIG. 1.

DETAILED DESCRIPTION

Figure 3:
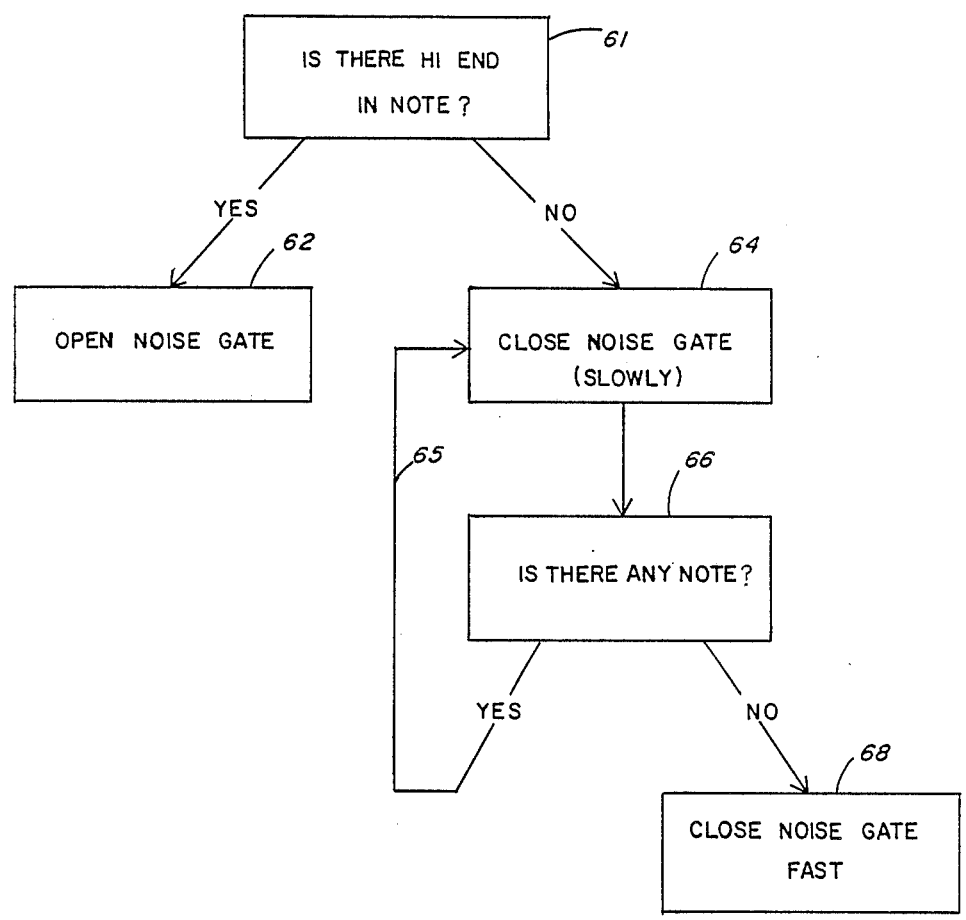
FIG. 3 is a flow chart associated with the circuit operation of FIG. 1.

Reference is now made to the circuit diagram of FIG. 1 that illustrates the embodiment of the audio noise gate of the present invention. This noise gate is tailored specifically to remove high frequency noise typically referred to as hiss or buzz. With the circuit of this invention the upper half of the audio spectrum is rolled off at say 6 dB per octave above a frequency on the order of about 1.5 KHz when no high frequencies are present in the signal. This leaves the fundamental and low harmonics unaltered for their full sustain. On the other hand, when high frequencies are present in the signal then the upper half of the audio spectrum is not rolled off.

In addition to removing high frequency noise, the audio noise gate of the present invention also operates in an automatic manner to essentially turn off hiss slowly when notes are held and quickly when notes are stopped short. In this regard the circuit automatically adjusts its own release time, quickly for staccato notes and slowly for notes that are held for infinite sustain.

As used herein, the term "low" when used in conjunction with low pass filters and the like is intended to refer to a range starting at about 50 Hz and ending at about 250 Hz to 800 Hz. In the same context, the word "middle" or "mid" is intended to refer to the range starting at about 250 Hz to 800 Hz and ending at about 1.5 KHz to 5 KHz. Lastly, the word "high" is intended to refer to the range starting about 1.5 KHz to 5 KHz and ending somewhere in the upper audio frequency spectrum.

With further specific reference to the circuit of FIG. 1, there is shown the input to the circuit at input terminal 10. This is where the input audio signal is coupled. Also shown is the output of the circuit which is at the output terminal 20. Coupled between the input terminal 10 and the output terminal 20 is the circuit 30 which is comprised of an input attenuator, a selective filter, and an output gain stage, all to be described in further detail. At the input to circuit 30, there is provided a resistor network that is comprised of resistors R28, R29 and R30. This resistor network forms an attenuator for reducing the voltage level of the input signal so that the voltage levels are of proper magnitude to be handled by the remainder of the circuit. With regard to the attenuator it is noted that the resistors R28 and R30 are connected in series and that the resistor R29 couples from the junction between resistors R28 and R30 to ground potential. From the attenuator there is provided a filter 30 which is adapted to have a variable high frequency roll-off as illustrated in FIG. 2. This filter has an input control node at 32 and comprises capacitor C10, resistor R183 and field effect transistor Q3. The capacitor C10 is coupled in series with the field effect transistor and in particular connects to the drain electrode of the field effect transistor. The source electrode of the field effect transistor is coupled to ground. The gate electrode of the field effect transistor Q3 couples from the node 32. The resistor R183 couples across the drain and source electrodes of the field effect transistor Q3. Voltages are developed at the node 32, to be described in further detail hereinafter, for controlling the conductivity of the field effect transistor Q3. When the field effect transistor Q3 is held non-conductive then the filter is essentially out of the circuit and in that instance the circuit 30 does not have the high frequencies rolled off. In that instance the frequency response takes the form of a curve C1 in FIG. 2. In other words, the higher frequencies are passed. This occurs, as to be described in further detail hereinafter, when the audio signal has high frequency content and it is thus desired to pass this high frequency content. Alternatively, when the voltage at the node 32 is of a value to hold the field effect transistor Q3 conductive then the filter is in the circuit and the values of components are selected so that there is a high frequency roll-off starting, for example, at 1.5 KHz as illustrated in FIG. 2 by the curve C2. As will be described in further detail hereinafter, this mode of operation occurs when the input audio signal does not have any high end content in which case it is desired to roll-off the high frequencies at say 6 dB per octave commencing at 1.5 KHz as illustrated by curve C2 in FIG. 2.

The output of the filter of circuit 30 couples to an output gain stage that is comprised of amplifier U8A along with resistors R31 and R32. The output from the filter couples to the assertion input of the amplifier. A voltage divider is formed by the resistors R31 and R32 with the junction between these resistor coupling to the negation input of the amplifier. The other side of resistor R32 couples to ground and the other side of resistor R31 couples to the output of the amplifier U8A. The values of the resistors R31 and R32 are selected to control the gain that occurs via the amplifier U8A.

In the circuit diagram there is also shown a switch SW1 that has a pair of poles shown as being ganged by illustration of the dotted line 34. The switch SW1 is manually operable by the user of the product to either incorporate the noise gate circuitry or to bypass it. In the particular position illustrated in the circuit diagram the switch is in a position in which it bypasses the noise gate. In this regard it is noted that one of the poles in this position couples the input terminal 10 directly to the ouptut terminal 20. At the same time the other pole opens the circuit to the light emitting diode CR205. The diode CR205 is illuminated to indicate that the high frequencies are being rolled off or in other words that hiss and buzz are being suppressed. The LED CR205 is off when the high-end signals are not being rolled-off.

When the switch SW1 is moved to the position opposite to that illustrated in the circuit diagram then of course the noise gate is in the circuit and likewise the LED CR205 may be operated.

In the circuit that is illustrated it is noted that there is also another signal line 12 that couples from the input terminal 10 to resistors R177 and R178. The resistors R177 and R178 are connected in series to ground and the junction bettween these resistors couples to a pair of attenuator networks 14 and 16.

In a simplified version of the present invention the attenuators 14 and 16 may be considered as optional. However, in the preferred embodiment of the invention the attenuators are employed. In the overall system in which the noise gate is employed there are a number of different modes of operation. Some of these different modes of operation are described in the circuit diagram and identified as an edge mode of operation which is a partial distortion mode of operation, a gain boost mode of operation and an autoclean mode of operation. With regard to the autoclean function please refer to co-pending application Ser. No. 06/877,224 filed June 20, 1986.

In the autoclean mode of operation the operation is much more sensitive and thus the high end roll-off eliminates itself at a much lower signal level. Thus, when not in the autoclean mode of operation the attenuation provided by attenuator 16 is employed so as to maintain proper compatibility.

The junction between the resistors R177 and R178 couples to the first attenuator 14. The attenuator 14 comprises attenuator device 15 and resistor R176. The signal then couples to a second attenuator 16 which is comprised of attenuator device 17 and resistor R179. It is noted that the resistor R176 is substantially larger than the resistor R179. Both of the devices 15 and 17 may be of type 14066B. The output of each device coupled to ground and the input couples to the respective resistors. The control line to each of the devices 15 and 17 is the signal that indicates that the input and output of the devices are coupled together in either the edge mode of operation or the gain boost mode of operation. This is the case with regard to device 15. With regard to device 17 the control line couples so that the device 17 intercouples the input and output thereof when not in the autoclean mode of operation. Thus, in the autoclean mode of operation only resistors R177 and R178 provide control of the signal coupled to the amplifier U19A. When not in the autoclean mode of operation then the resistor R179 is switched into the circuit to substantially attenuate the signal coupled to the amplifier U19A.

In the circuit diagram reference is also now made to the circuit for establishing the trigger threshold. This circuit is associated with the amplifier U19A and includes capacitor C77, resistor R180, and slide potentiometer VR202. It is noted that the moveable arm of the potentiometer VR202 is coupled to ground and that the potentiometer is coupled in series with both the resistor R180 and the capacitor C77. The capacitor C77 then couples to the negation input of the amplifier U19A. A resistor R169 couples between the negation input to the amplifier U19A and the output thereof.

The trigger potentiometer VR202 sets the sensitivity of the threshold of the noise gate. This setting may be from a zero setting to some maximum value. A setting at a zero setting causes the gate to wait until the end of the note to begin cutting high frequencies. If the guitar and associated equipment is noisy, the gate will not close at all when the trigger is set at its lowest position. On the other hand setting at its maximum position will cause the gate to cut high frequencies while notes are still playing. To adjust the threshold, one starts with the setting at its lowest position and a chord is played. One then listens for the noise as the note dies out. The potentiometer is then moved from its minimum position so that hiss is suppressed before the notes have completely died out. The LED CR205 is observed in association with this adjustment procedure so as to determine when hiss is being suppressed.

Thus, at the output of the amplifier U19A there is a signal that is representative of the input audio signal particularly as far as signal frequency content is concerned. It is noted that the output of the amplifier U19A connects to two different circuits including circuit 50 and circuit 60. Circuit 50 includes a high pass filter, a gain stage, and a peak detector. The circuit 60 is comprised of a peak detector also coupling to a field effect transistor Q8. The circuit 50 is adapted to detect whether or not there is high frequency content in the audio signal. It is noted that the output of the circuit 50 couples by way of line 52 to a gain stage and from there to the output line 54 that couples to the aforementioned control node 32.

The circuit 60 is provided for sensing whether a note is still being played or not. The circuit 60 is for controlling the release time of the circuit 50. In this regard the circuit 60 includes a field effect transistor Q8, the conductivity of which is controlled so as to either couple the resistor R170 into the circuit or out of the circuit so as to control release time as described in further detail hereinafter.

As indicated previously, the circuit 50 includes at its input a high pass filter that is comprised of two filtering stages including a first stage comprised of capacitor C11 and resistor R33 and a second stage comprised of capacitor C12 and resistor R34. This high pass filter detects whether there is any high frequency content in the audio signal. The output from the filter couples to the assertion input of the amplifier U9A. The negation input to the amplifier U9A is coupled from a resistor network that is comprised of resistor R35 and R36. The connection between these resistors couples to the negation input of the amplifier U9A. The other side of resistor R36 couples to ground and the other side of resistor R35 couples to the output of the amplifier U9A. The amplifier U9A with its associated resistors R35 and R36 provides a predetermined amount of gain. The output of the amplifier U9A couples to a peak detector that includes resistor R37, diodes CR8 and CR29 and capacitor C13. The output of the peak detector couples by way of line 52 to a gain stage that is comprised of resistors R38, R39 and R40 along with the amplifier U9B. It is noted that the output of the amplifier U9B couples to the line 54 which in turn couples to the node 32 which is the control terminal for the field effect transistor Q3. In connection with the gain stage it is noted that the resistor R38 couples to the assertion input of the amplifier U9B and also couples to ground. The resistor R40 similarly couples from the negation input of the amplifier U9B to ground. The resistor R39 couples between the negation input and the output of the amplifier U9B.

When high frequency content is detected by the high pass filter of circuit 30 there is a negative signal at the output of amplifier U9B coupled from the peak detector circuit. This negative voltage is coupled by way of the line 54 to the control node 32 to maintain the field effect transistor Q3 non-conductive. This means that the filter of circuit 30 is essentially out of the circuit and thus the frequency response is as defined by the curve C1 in FIG. 2.

The negative voltage output from the amplifier U9B is also coupled by way of resistor R41, zener diode ZR9 and switch SW1 to the light emitting diode CR205. This negative voltage maintains the diode CR205 in its off condition. As indicated previously this means that the high end is not being rolled off.

Now, when the circuit 50 does not detect any high frequency signals at its high pass filter then the output of the amplifier U9B is at a ground voltage which causes the field effect transistor Q3 to be conductive. This causes the filter comprised of capacitor C10, the transistor Q3 and resistor R183 to be in the circuit thus providing a high frequency roll-off as indicated by the curve C2 in FIG. 2. At the same time the ground output voltage from the amplifier U9B is coupled by way of resistor R41, zener diode ZR9 and switch SW1 to the light emitting diode CR205 to cause the diode to illuminate. Thus, the diode 205 illumination is representative of high frequency suppression of signals which occurs by virtue of causing conduction of the field effect transistor Q3. In this regard it is also noted that the resistor R183 associated with the field effect transistor Q3 is instrumental in limiting the swing of the range of frequency response such as between the 1.5 KHz and 25 KHz as illustrated in FIG. 2.

As has been mentioned previously, the circuit of the present invention provides for an automatic adjustment of release time quickly for staccato notes and slowly for notes held for infinite sustain. In order to provide this operation there is provided the circuit 60 which is basically adapted to sense whether or not a note is being played by determining whether an audio signal is present at the output of the amplifier U19A. The circuit 60 basically comprises an input capacitor C78 in series with an input resistor R168 that couple to the negation input of the amplifier U19B. The assertion input of the amplifier U19B is coupled to ground. The circuit 60 basically comprises a peak detector that includes diodes CR32 and CR35, resistors R166 and R167, diodes CR36 and capacitor C74. This circuit couples to the gate electrode of the field effect transistor Q8. The diode CR35 couples between the negation input and the output of the amplifier U19B. The resistor R167 is in series with the diode CR32 and they also couple in parallel with the diode CR35. Lastly, the diode CR36 couples across the resistor R167 and also couples by way of resistor R166 to the gate electrode of the field effect transistor Q8. The other side of capacitor of C74 is grounded as well as the drain electrode of field effect transistor Q8. The source electrode of transistor Q8 couples by way of resistor R170 to the line 52.

The output from the peak detector circuit of circuit 60 controls the field effect transistor Q8 to be either conductive or non-conductive. When the transistor Q8 is conductive then the circuit 60 has an effect on the circuit 50 by virtue of coupling the resistor R170, via the transistor Q8 to ground thus providing a much faster release time for the overall circuit. When the transistor Q8 is non-conductive then the resistor R170 essentially open circuit and has no effect on the circuit 50.

Thus when there is a signal present at the output of the amplifier U19A this is indicative of a note being held which is thus to have an infinite sustain. This slow release time is provided so that the signal does not precisely follow the note waveform. When the signal is present at the output of the amplifier U19A which as mentioned previously indicates that a note is held, the signal output from the peak detector of circuit 60 to the transistor Q8 in particular to the gate thereof is at a negative voltage level. This holds the field effect transistor Q8 non-conductive so that under this condition the resistor R170 is essentially out of the circuit. Thus, when a note is held there is the usual relatively long release time as controlled principly only from the circuit 50. This release time is determined primarily by the time constant of the capacitor C13 and the resistor R38. With regard to the circuit 50 the attack time is relatively fast and is determined primarily by the resistor R37 and the capacitor C13. In this regard note the resistor R37 is of the relatively small value particularly in comparison with the resistor R38. In the disclosed embodiment the resistor 37 is only 1.0K ohms while the resistor R38 is 22 megohms.

Now when a note is staccato or in the event that there really is no signal at all such as when one mutes a string without playing, then the output from the amplifier 19A ceases. When this occurs the circuit 60 provides a substantially ground signal to the gate electrode of the field effect transistor Q8. This causes the transistor Q8 to become conductive and thus introduce the resistor R170 into the circuit essentially in parallel with the resistor R38. The resistor R38 is substantially larger than the resistor R170, the resistor R170 preferably in the circuit described being 33K ohms. The release time regarding the circuit 60 is determined primarily by the resistor R167 and the capacitor C74. The release time of this circuit is much faster than the release time of the circuit including capacitor C13 and resistor R38.

Also, with regard to circuit 60 it is noted that the attack time is relatively fast. The attack time is determined primarily by the resistor R166 and the capacitor C74. Thus, the circuit 60 has both a relatively fast attack time as well as relatively fast release time. This means that when a note is played for only a short period of time or one say mutes a string, then rather than having the high frequency noise decay over a long release time the circuit of the present invention automatically detects this condition and thus automatically changes the release time to one that is rapid so that an unwanted noise signal is not generated.

Having now described the preferred circuit of the present invention, and furthermore with reference to the frequency response diagram of FIG. 2, reference may now be made to the flow chart of FIG. 3 which highlights the operation carried out by the circuit. There are described in FIG. 3 a series of boxes that represent certain decision points in carrying out the circuit operation. At the top of the diagram there is a box 61 that is a decision as to whether there is high frequency content in the note. If the decision is yes then box 62 indicates that the noise gate is to be opened. This means that this signal goes through without being rolled off as to high frequency content. If the decision from box 60 is a "no" then the noise gate is closed as illustrated by box 64. Box 66 couples from box 64 and indicates the question as to whether there is any note present. In connection with box 61 the determination as to whether there is high frequency content in the note is made by circuit 50. With regard to the box 66 in FIG. 3 the decision as to whether there is a note or not is determined by circuit 60. If it is determined that there is a note then the indication by the way of lines 65 indicates that the closing of the noise gate continues on a slow release time basis. On the other hand if the decision from box 66 is "no" indicating that there is no note being sustained by the player then the noise gate is closed rapidly as indicated by the box 68 in FIG. 3.

In connection with the circuit that is described herein, reference is now made to the following table that illustrates component values and component types relating to the different components that comprise the circuit including the resistors, capacitors, diodes, transistors and amplifiers.

TABLE

| COMPONENTS | VALUE OR TYPE |
|---|---|
| C10 | .0068 uf |
| C11 | .012 |
| C12 | 820 pf |
| C13 | .22 uf |
| C74 | .0047 uf |
| C77 | 10 uf |
| C78 | 1.0 uf |
| CR8 | 1N914 |
| CR9 | 1N5253 |
| CR29 | 1N914 |
| CR32 | 1N914 |
| CR35 | 1N914 |
| CR36 | RED LED |
| CR205 | YELLOW LED |
| Q8 | 2N4338 |
| R28 | 7.5K |
| R29 | 2.2K |
| R30 | 18K |
| R31 | 7.5K |
| R32 | 2.2K |
| R33 | 10K |
| R34 | 150K |
| R35 | 12K |
| R36 | 1.5K |
| R37 | 1.0K |
| R38 | 22 Meg |
| R39 | 22K |
| R40 | 10K |
| R41 | 33K |
| R166 | 2.7K |
| R167 | 1 Meg |
| R169 | 270K |
| R176 | 68K |
| R177 | 100K |
| R178 | 220K |
| R180 | 1K |
| R183 | 1 Meg |

TABLE-continued

| COMPONENTS | VALUE OR TYPE |
|---|---|
| U19A | TL072 |
| U19B | TL072 |
| U8A | TL072 |
| U9A | TL072 |
| U9B | TL072 |
| VR202 | 10K B Taper |

Having now described a preferred embodiment of the present invention, It should now be apparent to those skilled in the art that numerous other embodiments and modification thereof are contemplated as falling within the scope of the present invention as defined in the appended claims.

What is claimed is:

1. An audio noise gate comprising;
an input terminal for receiving an input audio signal that may have high end content audio signals,
an output terminal,
circuit means coupled between said input and output terminals and including high audio frequency filter means having a control node for determining frequency response and having at least two different roll-off frequencies including one that rolls-off high end content audio signals and one that passes high end content audio signals,
a high pass filter circuit coupled from said input terminal for sensing high end audio signal content,
means coupling the high pass filter circuit to the control node of the high audio frequency filter means to roll-off high end content audio signals through said circuit means in the absence of sensing high end audio signals by said high pass filter circuit, and to pass high end content audio signals through said circuit means in the presence of sensing high end audio signals by said high pass filter circuit,
signal detection means coupled from said output terminal for determining the presence or absence of the audio signal,
said high pass filter circuit including a high frequency detector circuit having a predetermined attack and release time,
and means coupling the output of the signal detection means to said high frequency detector circuit to control the release time thereof.

2. An audio noise gate as set forth in claim 1 wherein said signal detection means upon sensing of an audio signal permits the high frequency detector circuit to have said predetermined release time, and upon interruption of said audio signal provides for a substantial reduction in release time.

3. An audio noise gate as set forth in claim 2 wherein said signal detection means comprises a peak detector.

4. An audio noise gate as set forth in claim 3 including a control transistor coupled from said peak detector coupled in series with a resistor for controlling release time.

5. An audio noise gate as set forth in claim 4 wherein said peak detector controls said transistor to be conductive to in turn decrease the release time of the circuit of the gate.

6. An audio noise gate as set forth in claim 2 wherein said circuit means comprises a semi-conductor control means selectively operable to enable or disable said high audio frequency means.

7. An audio noise gate as set forth in claim 6 including an attenuator circuit at the input to said high audio frequency means.

8. An audio noise gate as set forth in claim 7 including a gain stage at the output of said high audio frequency filter means.

9. An audio noise gate as set forth in claim 2 wherein said high audio filter frequency means comprises a capacitor and a control transistor along with means for connecting said capacitor and control transistor in series.

10. An audio noise gate as set forth in claim 2 including a gain stage coupled from the output of said high pass filter circuit.

11. An audio noise gate as set forth in claim 10 including a peak detector coupled from the output of said gain stage.

12. An audio noise gate as set forth in claim 11 including a second gain stage coupled from said peak detector and having its output coupled to the control node.

13. A method of controlling the frequency and noise content of an audio signal in a processing channel comprising the steps of; providing a circuit for detecting high end audio content of the signal, providing a gate means, controlling the gate means to open the gate means upon detecting said high end audio content, and closing the gate means upon detecting absence of high end audio content, and further including one of detecting the presence of an audio signal in said channel and causing a slow release thereof upon the noise gate being closed, and detecting the absence of an audio signal in said channel to change the release time so that the note is released more rapidly.

* * * * *